United States Patent [19]

Furuta et al.

[11] Patent Number: 5,113,234
[45] Date of Patent: May 12, 1992

[54] SEMICONDUCTOR DEVICE HAVING REDUCED CONTACT RESISTANCE BETWEEN DIFFUSION REGIONS AND WIRING LAYER

[75] Inventors: Takashi Furuta, Takatsuki; Shuichi Nishida, Otsu, both of Japan

[73] Assignee: Matsushita Electronics Corporation, Osaka, Japan

[21] Appl. No.: 653,158

[22] Filed: Feb. 11, 1991

Related U.S. Application Data

[63] Continuation of Ser. No. 267,283, Nov. 4, 1988, abandoned.

[30] Foreign Application Priority Data

Nov. 13, 1987 [JP] Japan .................... 62-287901

[51] Int. Cl.⁵ ............... H01L 29/78; H01L 29/04
[52] U.S. Cl. ...................... 357/33.3; 357/59
[58] Field of Search ............. 357/59 G, 23.3, 23.4

[56] References Cited

U.S. PATENT DOCUMENTS

| | | | |
|---|---|---|---|
| 4,433,468 | 2/1984 | Kawamata | 29/571 |
| 4,477,962 | 10/1984 | Godejahn, Jr. | 29/571 |
| 4,512,073 | 4/1985 | Hsu | 29/571 |
| 4,935,379 | 6/1990 | Toyoshima | 437/44 |

FOREIGN PATENT DOCUMENTS 2075255 11/1981 United Kingdom .

OTHER PUBLICATIONS

"High Speed Bipolar ICs Using Super Self-Aligned Process Technology"; Sakai et al.; *Japanese Journal of Applied Physics*, vol. 20 (1981) Supplement 20-1, pp. 155-159.

*Primary Examiner*—Andrew J. James
*Assistant Examiner*—Stephen D. Meier
*Attorney, Agent, or Firm*—Wenderoth, Lind & Ponack

[57] ABSTRACT

A semiconductor device includes first and second oxide film regions formed on a surface of a semiconductor substrate. A first impurity diffusion region is located at a distance from one of the first and second oxide regions. A second impurity diffusion region is located along the surface of the semiconductor substrate and partially overlaps the first impurity diffusion region. The width of the second impurity diffusion region is greater than that of the first impurity diffusion region. A contact hole is provided extending substantially over the second impurity diffusion region. The contact hole has a first side wall defined by one of the first and second oxide film regions and a second side wall defined by an insulating film. The width of the opening of the contact hole is greater than or equal to the width of the first impurity diffusion region. A conductive film is formed along the bottom portion and along the opposite side walls of the contact hole. A wiring layer is provided connected to the conductive film.

12 Claims, 1 Drawing Sheet

SEMICONDUCTOR DEVICE HAVING REDUCED CONTACT RESISTANCE BETWEEN DIFFUSION REGIONS AND WIRING LAYER

This application is a continuation of now abandoned application, Ser. No. 07/267,283 filed on Nov. 4, 1988.

BACKGROUND OF THE INVENTION

1. Field of the Invention

This invention relates to a semiconductor device and manufacturing method thereof for providing a stable connection between an impurity diffusion region formed in a semiconductor substrate and a wiring layer formed on the surface of an insulation film on the semiconductor substrate via a contact hole formed in the insulation film.

2. Description of the Related Art

In a semiconductor device, generally, oxide film regions are selectively formed on the surface of a semiconductor substrate for separating devices from one another along the surface of the substrate. At least one impurity diffusion region is formed in the semiconductor substrate between such oxide film regions. An insulation film is then formed on the semiconductor substrate, and a wiring layer is formed on this insulation film. The impurity diffusion region and wiring layer are connected together by way of a contact hole formed in the insulation film.

When the width of the contact hole is greater than the width of the impurity diffusion region, a portion of the contact hole extends to the oxide film which is adjacent to the impurity diffusion region. As a result, the wiring material formed in the contact hole directly contacts the semiconductor substrate, causing a so-called current leak. To avoid this problem, the width of the contact hole is usually set to be smaller than the width of the impurity diffusion region. Additionally, the forming position of the contact hole is set at a position remote from the oxide films.

Meanwhile, an integration of the semiconductor integrated circuit increases and the semiconductor elements become smaller, the device areas defined by the oxide films becomes smaller, and the area of the impurity diffusion regions formed therein also tend to be smaller. As a result, the width of the contact hole is becoming smaller.

When the area of the contact hole becomes smaller, the contact resistance between the impurity diffusion region and wiring layer increases. Additionally, the smaller the area of the impurity diffusion region, the shorter the distance between the periphery of the contact hole and the edge of the oxide film. As a consequence, the patterning allowance between the impurity diffusion region and the contact hole decreases, and positioning of the two becomes extremely difficult.

SUMMARY OF THE INVENTION

It is hence a primary object of this invention to provide a semiconductor device and manufacturing method thereof capable of sufficiently widening the contact area between the wiring layer and the impurity diffusion region and thus decreasing the contact resistance, even if the area between the oxide films is small and the area of the impurity diffusion region formed therein is small.

It is a second object of this invention to provide a semiconductor device and manufacturing method thereof capable of facilitating the positioning of the impurity diffusion region and contact hole by increasing the patterning allowance therebetween.

It is a third object of this invention to provide a semiconductor device and manufacturing method thereof capable of patterning the contact hole itself quite easily, so that the reliability of connection between the impurity diffusion region and wiring layer may be enhanced.

The features and other objects of this invention will be better understood and appreciated from the following detailed description taken in conjunction with the drawings.

DETAILED DESCRIPTION OF THE INVENTION

One of the embodiments of the present invention is described below with reference to the cross sectional views of the manufacturing stages shown in FIGS. 1 and 2.

Figure 1:
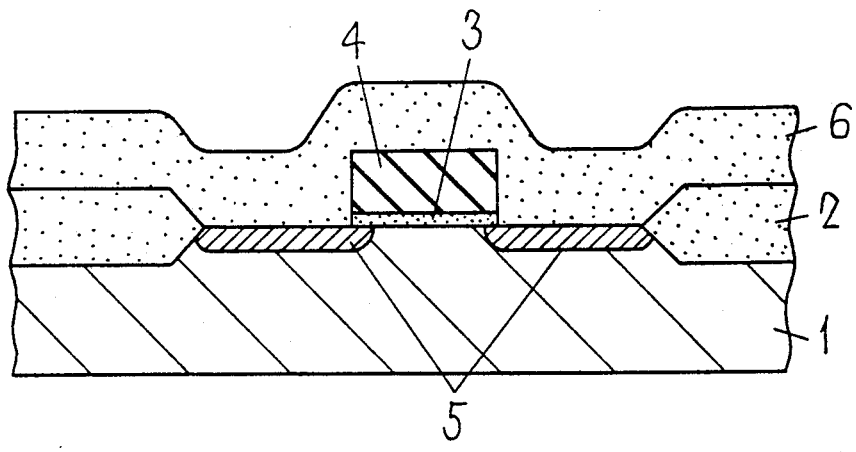
FIG. 1 is a sectional view of a stage of forming a first insulation film of a semiconductor device in one of the embodiments of the present invention.
Figure 2:
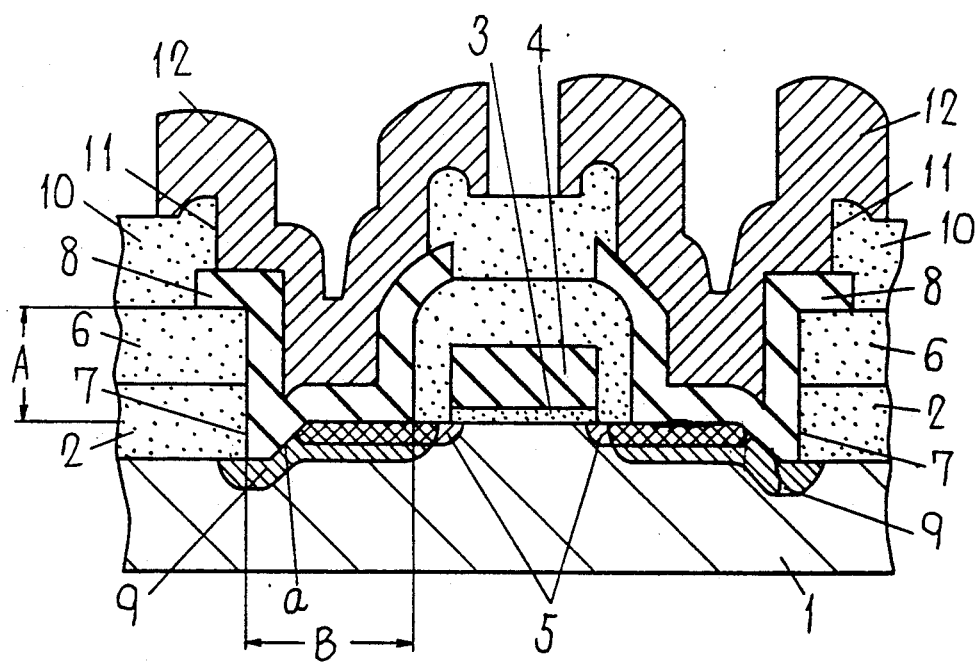
FIG. 2 is a sectional view of a stage of forming a wiring layer of the semiconductor device in the same embodiment.

FIGS. 1 and 2 show a transistor component, including it peripheral portion, of a MOS type semiconductor device.

Predetermined portions of the surface of a P-type silicon substrate 1 are selectively oxidized to form oxide films 2, 2 for separating devices from one another along the surface of the substrate 1. Then, using conventional techniques, a gate oxide film 3 and a gate electrode 4 are centrally formed between the oxide films 2, 2. Subsequently, using a self-alignment technique and the gate electrode 4 as a mask, an impurity is diffused on the surface of the P-type silicon substrate 1, and first N+ diffusion regions 5 are formed as drain and source regions. Furthermore, a first insulation film 6 is formed on the entire surface of the P-type silicon substrate 1. In this way, the basic structure of an N-channel type MOS transistor is completed.

Next, as shown in FIG. 2, first contact holes 7 are formed in the first insulation film 6. A portion of the periphery of the first contact holes 7 extends beyond the outer ends of the first N+ diffusion regions. The first contact holes 7 each have a width which is sufficient to eliminate the inner edges of the oxide films 2 which are adjacent to the first N+ diffusion regions 5. Therefore, at this stage, portions of the P-type silicon substrate 1 are directly exposed in the first contact holes 7. Conductive films 8 are then formed on the bottom, inner wall and upper peripheral portions of the first contact holes 7. As the conductive film 8, polysilicon or polycide may be used. Through each conductive film 8, phosphorus ions (P+) are implanted at an accelerating voltage of 100 keV and at a dosage of $1 \times 10^{15}/cm^2$, and further, by performing heat treatment for activation, second N+ diffusion regions 9 are formed in the P-type silicon substrate 1. The second N+ diffusion regions 9 extends from beneath the oxide films 2 to almost the gate electrode 4. Therefore, the second N+ diffusion regions 9 are formed in the portion of the P-type silicon substrate 1 which was directly exposed to the first contact holes 7. Thus, each conductive film 8 makes an ohmic contact with the first and second N+ diffusion regions 5, 9. As shown, the first and second N+ diffusion regions 5 and 9 partly overlap each other to form a single N+ diffusion region. This ohmic contact area exists over almost the entire surface of the first and second N+ diffusion regions 5, 9.

Next, a second insulation film 10 is formed on the surface of the first insulation film 6 and second contact holes 11 are formed in the second insulation film 10 to connect the conductive films 8 to wiring layers 12 which are to be formed on the second insulation film 10. The second contact holes 11 are each large enough so that the inner circumference thereof approaches the outermost periphery of each conductive film 8 as shown.

Finally, wiring layers 12 of aluminum or the like are formed on the surface of the second insulation film 10 and inside the second contact holes 11 as shown. The wiring layer is then patterned as required. As a result, the first and second N+ diffusion regions 5, 9 are connected to the wiring layers 2 by way of the conductive films 8.

As described herein, according to this embodiment, the first contact hole 7 is sufficiently wide so as to project from the first N+ diffusion region 5 to the partially removed edge of the oxide film 2. In other words, it is possible to form a sufficiently wide first contact hole without being confined by the first N+ diffusion region 4 or the edge of the oxide film 2. Still more, the area of ohmic contact is sufficiently wide because the conductive film 8 is formed in the first contact hole 7 and this conductive film 8 is brought into contact with the diffusion region. Therefore, the contact resistance between the diffusion region and the wiring layer may be sufficiently reduced. Moreover, the conductive film 8 is formed in the first contact hole 7, and then the second N+ diffusion region 9 is formed in the P-type silicon substrate 1 through the conductive film 8. It is hence possible to form a diffusion region having a proper size and position of the first contact hole 7. Therefore, as for positioning of the first N+ diffusion region 5 and first contact hole 7, a sufficiently wide mask matching allowance is provided as compared with the prior art, thereby enhancing the prod of semiconductor device. Incidentally, as a way of describing the final structure shown in FIG. 2, the diffusion regions 5 and 9 may be deemed to actually define three diffusion regions. That is, as shown in FIG. 2, a first diffusion region is defined by the portion of the diffusion region 5 which does not overlap the diffusion region 9, a second diffusion region is defined by the overlapping portions of the diffusion regions 5 and 9, and a third diffusion region is defined by the portion of the diffusion region 9 which does not overlap the diffusion region 5.

Additionally, since the first contact hole 7 is formed within the first insulation film 6, the ratio of the width to depth (A/B in FIG. 2) of the first contact hole may be reduced. As a result, formation of the first contact hole 7 is facilitated, and formation related failures of the first contact hole 7 maybe reduced. Still more, by forming the upper end part of the conductive film 8 above the first insulation film 6, the second contact hole 11, which is larger than the first contact hole 7, is formed in the second insulation film 10 on the conductive film 8, so that the formation of the second contact hole 11 is facilitated and the ohmic contact between the conductive film 8 and the wiring layers 12 becomes extremely stable.

As the conductive film 8, polysilicon and polycide can be used. When polyside is used, the contact resistance between the diffusion region and the wiring layer may be significantly decreased. In this embodiment, the P-type silicon substrate is used as the semiconductor substrate, but is it also possible to use an N-type silicon substrate as the semiconductor substrate, and to form P+ diffusion regions as the source and drain regions.

We claim:

1. A semiconductor device comprising:
   a semiconductor substrate of a first type of conductivity;
   first and second oxide film regions located respectively at first and second locations on a surface of said semiconductor substrate, said first and second oxide film regions defining a first distance therebetween extending in a first direction;
   a first impurity diffusion region of a second type of conductivity extending a second distance in said first direction between said first and second oxide film regions along said surface of said semiconductor substrate, and being spaced from said first and second oxide film regions;
   a second impurity diffusion region of said second type of conductivity extending a third distance in said first direction from adjacent said first impurity diffusion region along said surface of said semiconductor substrate, said third distance being substantially greater than said second distance;
   a third impurity diffusion region of said second type of conductivity having a first portion extending in said first direction along said surface of said semiconductor substrate from adjacent said second impurity diffusion region to beneath said first oxide film region, and having a second portion extending in said first direction beneath said second impurity diffusion region from said first impurity diffusion region to said first portion;
   wherein said first, second and third impurity diffusion regions do not overlap each other;
   a first contact hole having a bottom portion defined by almost an entire surface area of said second impurity diffusion region and said first portion of said third impurity diffusion region and a first side wall defined by said first oxide film region and an opposite second side wall located a fourth distance in said first direction from said first side wall;
   wherein a distance of said third impurity diffusion region in said first direction is greater than said fourth distance and greater than a sum of said second and third distances;
   a conductive film formed along said bottom portion of said first contact hole in contact with said second and third impurity diffusion regions; and,
   a wiring layer connected to said conductive film.

2. A semiconductor device as recited in claim 1, further comprising:
   a first insulating film having a first portion located on said first oxide film region to further define said first side wall of said first contact hole and a second portion located on said surface of said semiconductor substrate to define said second wall of said first contact hole;
   said conductive film extending from said bottom portion of said first contact hole along said first and second side walls of said first contact hole and having opposite end portions respectively located on an upper surface of said first portion and said second portion of said first insulating film;

a second contact hole having an opening extending a fifth distance in said first direction, said second contact hole being located above said first contact hole relative said semiconductor substrate and said fifth distance being greater than said fourth distance;

a second insulating film having first and second portions respectively located on said upper surface of first and second portions of said first insulating film, said first and second portions of said second insulating film defining opposite side walls of said second contact hole.

3. A semiconductor device as recited in claim 2, said conductive film including one of polysilicon and polycide.

4. A semiconductor device as recited in claim 3, said second and third impurity diffusion regions being formed by diffusion of an impurity via said conductive film.

5. A semiconductor device as recited in claim 2, said second and third impurity diffusion regions being formed by diffusion of an impurity via said conductive film.

6. A semiconductor device as recited in claim 1, said conductive film including one of polysilicon and polycide.

7. A semiconductor device as recited in claim 6, said second and third impurity diffusion regions being formed by diffusion of an impurity via said conductive film.

8. A semiconductor device as recited in claim 1, said second and third impurity diffusion regions being formed by diffusion of an impurity via said conductive film.

9. A semiconductor device comprising:

a semiconductor substrate of a first type of conductivity;

a first impurity diffusion region of a second type of conductivity extending a first distance in a first direction along a surface of said semiconductor substrate;

a second impurity diffusion region of said second type of conductivity extending a second distance in said first direction from adjacent said first impurity diffusion region along said surface of said semiconductor substrate, said second distance being substantially greater than said first distance;

a third impurity diffusion region of said second type of conductivity extending in said first direction along said surface of said semiconductor substrate from beneath said second impurity diffusion region;

wherein said first, second and third impurity diffusion regions do not overlap each other;

a conductive film extending a third distance substantially along almost an entire surface area of said second and third impurity diffusion regions in said first direction;

wherein a distance of said third impurity diffusion region in said first direction is greater than said third distance and greater than a sum of said first and second distances; and a wiring layer connected to substantially an entire surface of said conductive film.

10. A semiconductor device as recited in claim 9, said conductive film including one of polysilicon and polycide.

11. A semiconductor device as recited in claim 10, said second impurity diffusion region being formed by diffusion of an impurity via said conductive film.

12. A semiconductor device as recited in claim 9, said second impurity diffusion region being formed by diffusion of an impurity via said conductive film.

* * * * *